(12) United States Patent
Farrugia et al.

(10) Patent No.: US 7,415,692 B1
(45) Date of Patent: *Aug. 19, 2008

(54) METHOD FOR PROGRAMMING PROGRAMMABLE LOGIC DEVICE WITH BLOCKS THAT PERFORM MULTIPLICATION AND OTHER ARITHMETIC FUNCTIONS

(75) Inventors: Jennifer Farrugia, Woodbridge (CA); Elias Ahmed, Toronto (CA); Mark Bourgeault, Mississauga (CA)

(73) Assignee: Altera Corporation, San Jose, CA (US)

( * ) Notice: Subject to any disclaimer, the term of this patent is extended or adjusted under 35 U.S.C. 154(b) by 324 days.

This patent is subject to a terminal disclaimer.

(21) Appl. No.: 11/223,193

(22) Filed: Sep. 8, 2005

Related U.S. Application Data

(63) Continuation of application No. 10/294,234, filed on Nov. 13, 2002, now Pat. No. 6,971,083.

(51) Int. Cl.
*G06F 17/50* (2006.01)
(52) U.S. Cl. .............................. 716/17; 716/16; 716/18
(58) Field of Classification Search .............. 716/16–18
See application file for complete search history.

(56) References Cited

U.S. PATENT DOCUMENTS

| | | | |
|---|---|---|---|
| 5,036,473 A | | 7/1991 | Butts et al. |
| 5,043,914 A | | 8/1991 | Nishiyama et al. |
| 5,197,016 A | * | 3/1993 | Sugimoto et al. ............... 716/8 |
| 5,287,511 A | * | 2/1994 | Robinson et al. ............ 717/106 |
| 5,296,935 A | * | 3/1994 | Bresler ....................... 358/406 |
| 5,351,206 A | | 9/1994 | Yang et al. |
| 5,524,244 A | * | 6/1996 | Robinson et al. ............ 717/140 |
| 5,530,664 A | | 6/1996 | Tsubata et al. |
| 5,553,001 A | | 9/1996 | Seidel et al. |
| 5,661,660 A | | 8/1997 | Freidin |
| 5,815,405 A | | 9/1998 | Baxter |
| 5,854,929 A | * | 12/1998 | Van Praet et al. ............ 717/156 |
| 5,867,400 A | | 2/1999 | El-Ghoroury et al. |
| 5,892,678 A | | 4/1999 | Tokunoh et al. |
| 6,094,726 A | * | 7/2000 | Gonion et al. ............... 713/400 |
| 6,134,707 A | | 10/2000 | Herrmann et al. |
| 6,185,724 B1 | | 2/2001 | Ochotta |
| 6,219,628 B1 | | 4/2001 | Kodosky et al. |
| 6,223,329 B1 | * | 4/2001 | Ling et al. ...................... 716/7 |
| 6,298,319 B1 | | 10/2001 | Heile et al. |
| 6,298,472 B1 | * | 10/2001 | Phillips et al. ................. 716/18 |
| 6,360,356 B1 | * | 3/2002 | Eng ............................. 716/18 |
| 6,367,056 B1 | * | 4/2002 | Lee ............................... 716/5 |

(Continued)

*Primary Examiner*—Thuan V. Do
*Assistant Examiner*—Naum B Levin
(74) *Attorney, Agent, or Firm*—Ropes & Gray LLP; Jeffrey H. Ingerman

(57) ABSTRACT

A programming method efficiently programs programmable logic devices of the type having specialized multiplier blocks that include multipliers and other arithmetic function elements. Such blocks can be used to perform certain multiplication and multiplication-related functions more efficiently than general-purpose programmable logic. In order to efficiently program devices having such specialized multiplier blocks, so that they are used to their full potential and so that the maximum number of multiplier-related functions can be accommodated on a single programmable logic device, the programming method pre-processes the netlist of function blocks in a user's programmable logic design, grouping multiplication and multiplication-related functions efficiently. The method takes into account limitations imposed by the structure of the specialized multiplier blocks, in addition to location constraints imposed by the user and location constraints dictated by the need for certain functions be carried out near where certain other functions are carried out.

24 Claims, 6 Drawing Sheets

U.S. PATENT DOCUMENTS

| | | | |
|---|---|---|---|
| 6,477,683 B1 * | 11/2002 | Killian et al. | 716/1 |
| 6,584,601 B1 | 6/2003 | Kodosky et al. | |
| 6,785,700 B2 * | 8/2004 | Masud et al. | 708/400 |
| 6,862,563 B1 * | 3/2005 | Hakewill et al. | 703/14 |
| 7,051,313 B1 * | 5/2006 | Betz et al. | 716/17 |
| 7,210,112 B2 * | 4/2007 | DeHon et al. | 716/9 |
| 2002/0069396 A1 | 6/2002 | Bhattacharya et al. | |
| 2004/0015528 A1 | 1/2004 | Langhammer et al. | |
| 2004/0098438 A1 * | 5/2004 | Chung | 708/523 |
| 2004/0103265 A1 | 5/2004 | Smith | |

* cited by examiner

METHOD FOR PROGRAMMING PROGRAMMABLE LOGIC DEVICE WITH BLOCKS THAT PERFORM MULTIPLICATION AND OTHER ARITHMETIC FUNCTIONS

This is a continuation of commonly-assigned U.S. patent application Ser. No. 10/294,234, filed Nov. 13, 2002, now U.S. Pat. No. 6,971,083.

BACKGROUND OF THE INVENTION

This invention relates to programmable logic devices having blocks that perform multiplication and other arithmetic functions. More particularly, this invention relates to a method for programming such programmable logic devices while taking into account constraints imposed by those blocks or by users.

Programmable logic devices are well known. Early programmable logic devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations. At some point, such devices began to be provided with embedded blocks of random access memory that could be configured by the user to act as random access memory, read-only memory, or logic (such as P-TERM logic).

As programmable logic devices have become larger, it has become more common to add dedicated multiplier circuits on the programmable logic devices. Whereas in prior programmable logic devices space was not available for dedicated multipliers, current larger devices can accommodate multipliers. This spares users from having to create multipliers by configuring the available logic. Moreover, as described in copending, commonly-assigned U.S. patent application Ser. No. 09/955,645, filed Sep. 18, 2001, specialized multiplier blocks may be provided including multipliers and other arithmetic circuits such as adders and/or subtracters and/or accumulators. Such blocks are sometimes referred to as "multiplier-accumulator blocks" or "MAC blocks." Such blocks, for example, may be useful in digital signal processing, such as is performed in audio applications, and therefore such specialized multiplier blocks also are sometimes referred to as "DSP blocks."

While it may have been possible to program the earliest programmable logic devices manually, simply by determining mentally where various elements should be laid out, it was common even in connection with such earlier devices to provide programming software that allowed a user to lay out logic as desired and then translate that logic into programming for the programmable logic device. With current larger devices, it would be impractical to attempt to lay out the logic without such software.

The aforementioned specialized multiplier blocks present issues that had not existed in prior generations of programmable logic devices. In particular, because such blocks are large and complex, the number of such blocks on any one device may be relatively small, and they are placed in specific locations. Therefore, any programming software or method used with such devices must be able to implement a user logic design that incorporates the specialized multiplier blocks, including obeying the constraints imposed by those blocks or by the user, as well as by the relative location of those blocks to other logic regions with which they must interact.

SUMMARY OF THE INVENTION

In accordance with this invention, there is provided a method, which may be implemented in software, for programming a programmable logic device incorporating specialized multiplier blocks. The method takes into account the constraints and considerations discussed above by preprocessing the portion of the user design related to the specialized multiplier blocks prior to processing the design as a whole. The method attempts to assure that there is space on the device for the various multiplier and multiplier-related functions that are included in the user design, and that those functions can be placed near one another, or near other functional elements on the device, as dictated by the user design, without violating any other constraints, including those imposed by the user design and those imposed by the device hardware itself.

In a method according to the invention, a list of programming elements for a user design is parsed, programming elements related to the specialized multiplier blocks are identified in that list of programming elements for the user design, and those programming elements related to the specialized multiplier blocks are preprocessed prior to processing of the overall list of programming elements for the programmable logic device. During preprocessing, the grouping of multiplier and multiplier-related functions within the specialized multiplier blocks is determined, although the actual placement of a particular logical multiplier block into a particular physical multiplier block is not finally determined until processing of the full list of programming elements for the device, because the final placement may be a function of the interaction of one or more multiplier blocks with the remainder of the device logic. This may be so even if it is determined during preprocessing that, e.g., a pair of specialized multiplier blocks must be assigned to a pair of adjacent physical specialized multiplier blocks—which particular pair of adjacent physical multiplier blocks is used is not normally determined until the main processing step.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention may be implemented in software for programming a user design into a programmable logic device. Such software is typically provided as a design tool by the manufacturer of the programmable logic device. For example, the method of the present invention may be incorporated into the QUARTUS® II programming tool software available from Altera Corporation, of San Jose, Calif. While such software generally is designed for particular programmable logic devices, the method according to the invention can be incorporated into any such software. As such, the method of the present invention includes the ability to read a description, provided to the software, of the physical parameters of a particular programmable logic device on which a logic design is to be implemented, and to take into account the physical constraints of that particular programmable logic device, without the method of the invention itself being limited to any particular programmable logic device.

As discussed above, the method according to the present invention uses its "knowledge" of the structure of a specialized multiplier block, as well as its "knowledge" of the number and distribution of such blocks on a particular programmable logic device, to lay out those functions of a user design that are to be implemented in the specialized multiplier blocks in an efficient way, subject to any constraints imposed by the structure of the device in general, and of the specialized multiplier blocks in particular, as well as constraints, if any, imposed by the user.

The invention will now be described with reference to FIGS. 1-4.

Figure 1:
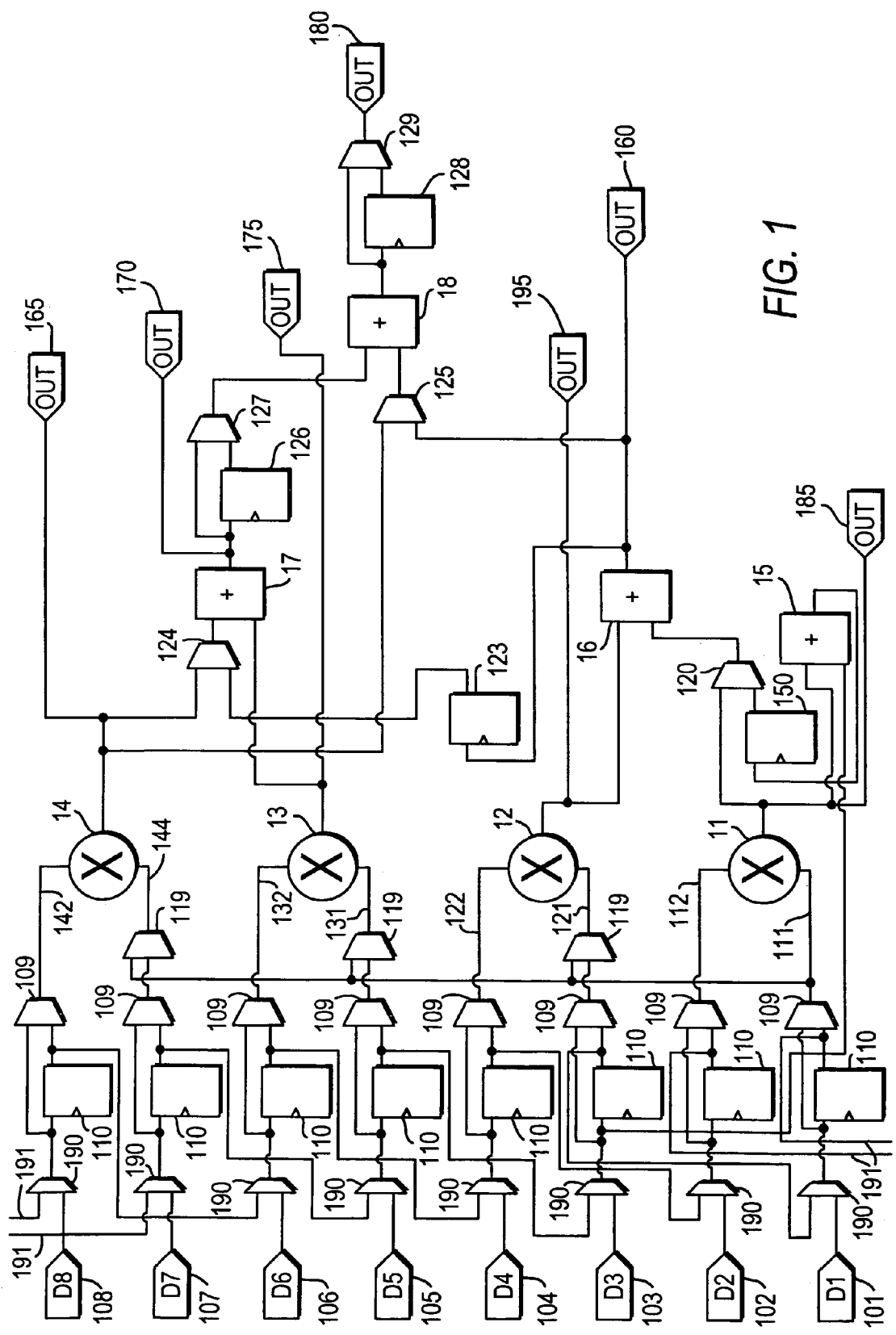
FIG. 1 is a schematic representation of a preferred embodiment of a specialized multiplier block with which the present invention may be used.

FIG. 1 shows the circuitry of a preferred embodiment of a specialized multiplier block 10 of the type described above. Specialized multiplier block 10, having inputs 101-108, preferably includes four multipliers 11, 12, 13 and 14. In a preferred embodiment, each of multipliers 11-14 is an 18-bit-x-18-bit multiplier, meaning that each can determine, as a 36-bit binary output, the product of two 18-bit binary multiplicand inputs, or the two products (concatenated into one 36-bit number) of two pairs of 9-bit binary multiplicand inputs (concatenated into one pair of 18-bit numbers). Each specialized multiplier block 10 preferably also includes a number of adder/subtracters 15, 16, 17 and 18 allowing the performance of addition and subtraction of the outputs of the various multipliers 11-14, as well as—in the case of adder/subtracter 15 when used with register 150—an accumulator function.

Additional registers 123, 126, 128, along with multiplexers 120, 124, 125, 127, 129, allow the construction of other combinations of sums and differences of the registered or unregistered products of multipliers 11-14. Multiplexers 119 allow the various multipliers 11-14 to share one input 101. Similarly, multiplexers 109 and registers 110 allow each of multiplier inputs 111, 112, 121, 122, 131, 132, 141, 142 to be registered or unregistered. In addition, registers 110, when used with multiplexers 190, can form input shift register chains that allow data to be entered serially. Such input shift register chains can even extend to other different specialized multiplier blocks via connections 191. The various functions may be output at 160, 165, 170, 175, 180, 185, 195.

According to the invention, if a user design includes multiplication and other arithmetic circuit elements, those elements, which may be referred to as "MAC elements," preferably are automatically grouped into a specialized multiplier block such as block 10. MAC elements grouped together preferably can perform, within the specialized multiplier block, the specialized functions of multiplication, multiplication followed by addition, multiplication followed by subtraction, and multiplication followed by accumulation.

As can be seen, specialized multiplier block 10 is a complex circuit that can support many operations. However, the number of operations or MAC elements that can be performed within a single specialized multiplier block 10 depends on what types of operations are to be performed, because if one operation uses multiple adder/subtracter units on the outputs of certain of multipliers 11-14, then it is plain that those adder/subtracter units are not available to be used with the outputs of others of multipliers 11-14. Another restriction is that specialized multiplier block 10 may only support a fixed number of control signals (e.g., multiplexer control signals). The method according to the invention takes these limitations into account to group MAC elements while also maximizing circuit speed, routability and density.

Figure 2:
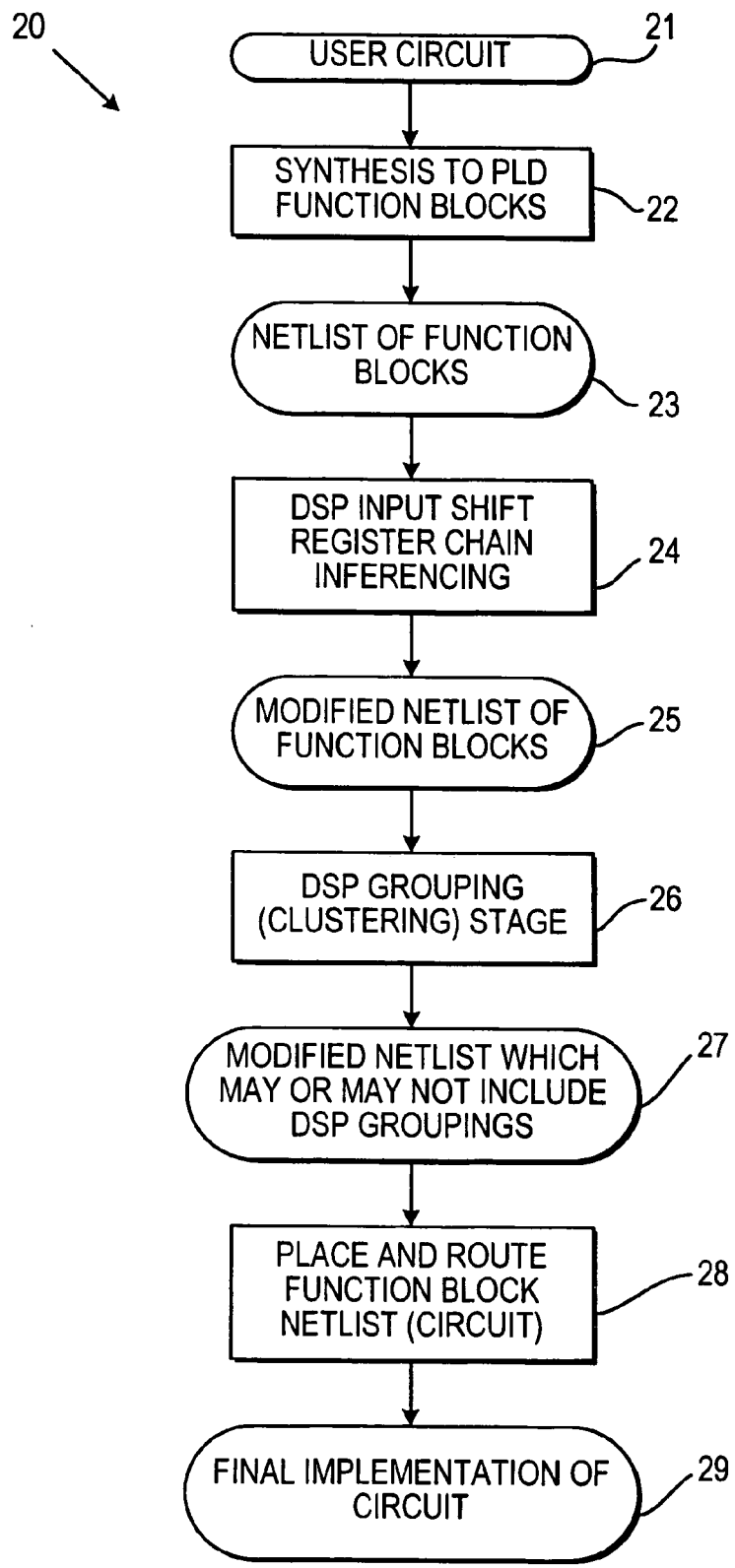
FIG. 2 is a flow diagram representing a preferred embodiment of the method according to the present invention for programming a programmable logic device with a user design incorporating specialized multiplier functions.

A preferred embodiment of a programmable logic device programming method 20 according to the invention is shown in FIG. 2. A user inputs his or her design at 21 using an interface provided for that purpose, which may be a textual or graphical interface. Next, at step 22, the user design is processed by a conventional synthesis tool such as that included within the aforementioned QUARTUS® II software, or any other synthesis tool—including, as examples only, the SYNPLICITY® and SYNPLICITY PRO® tools available from Synplicity, Inc., of Sunnyvale, Calif., and the LeonardoSpectrum™ tool available from Mentor Graphics Corporation, of Wilsonville, Oreg.—that converts the user design to programmable logic device function blocks. In order to accomplish this function, the synthesis tool is programmed with the structure of the programmable logic device for which the design is intended, so that it "knows" what type of elements are legal for the chosen device. When the user design entered at 21 contains MAC elements, those elements are identified by the synthesis tool at step 22. From the point of view of the synthesis tool, there are two kinds of MAC elements—viz., MAC_mult elements which represent the actual multiplication portion of a MAC function, and MAC_out elements which represent the non-multiplication portion of a MAC function. A MAC_out element could be a simple output (if the MAC function is simple multiplication) or an addition, subtraction or accumulation operation. The result of step 22 is a netlist 23 of function blocks, which as is well-known is the conventional input to place-and-route software for programmable logic devices.

Netlist 23 could be input to conventional place-and-route software, and may produce a usable output. However, the synthesis tools generally operate at the level of the individual MAC_mult and MAC_out elements, and generally are "ignorant" of the device structure at the specialized multiplier block level. Therefore, while the place-and route software might generate usable output from netlist 23, any such output would not be expected to efficiently utilize specialized multiplier blocks 10 except possibly by happenstance (which is improbable). In accordance with the present invention, efficient use may be made of the specialized multiplier blocks 10 without the synthesis tool—or, for that matter, the user at the design stage—knowing or being concerned with the hardware limitations at the specialized multiplier block level.

In accordance with a preferred embodiment of the invention, netlist 23 is input to Input Shift Register Chain Inferencing step 24. As discussed above, registers 110 and multiplexers 190 can be used to form input shift register chains. It may be that the user will specify the formation of such chains in certain designs. However, even where the user does not so specify, Input Shift Register Chain Inferencing step 24 examines the design to find instances where the design can be made more efficient by use of input shift register chains. For example, Input Shift Register Chain Inferencing step 24 may look for instances where a shift register is used at the inputs of multiplier (MAC_mult) elements, and may "pull the registers in" where appropriate—i.e., using the availability of registers 110 inside block 10, Input Shift Register Chain Inferencing step 24 would incorporate the separate shift register element into the multiplication element.

However, the shift register might not be "pulled in" if its output needed to be routed elsewhere on the general interconnect of the programmable logic device, because in such a case, routing into block 10 and then back out might actually result in a speed or efficiency penalty. Similarly, input/output timing or other timing considerations might militate against "pulling in" the chain. It further should be noted that input shift register chains could extend between different blocks 10. However, as discussed in more detail below, there may be a limited number of specialized multiplier blocks 10 on the programmable logic device which limits where chains may be placed, and any chain created by Input Shift Register Chain Inferencing step 24 (and even chains designated by the user) may be broken in the final implementation.

Figure 3:
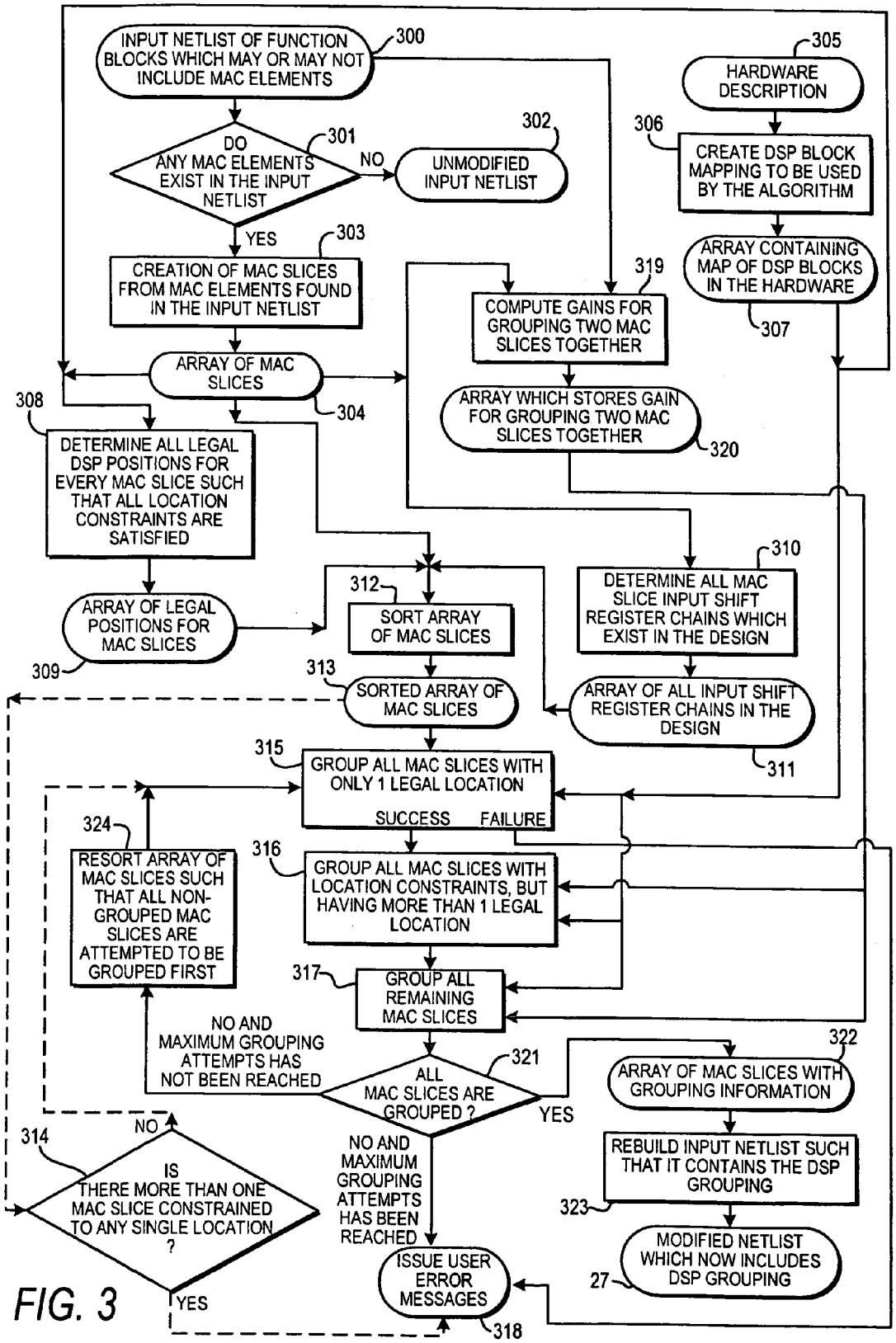
FIG. 3 is a flow diagram representing a preferred embodiment of specialized multiplier block grouping step of the method diagrammed in FIG. 2.
Figure 4:
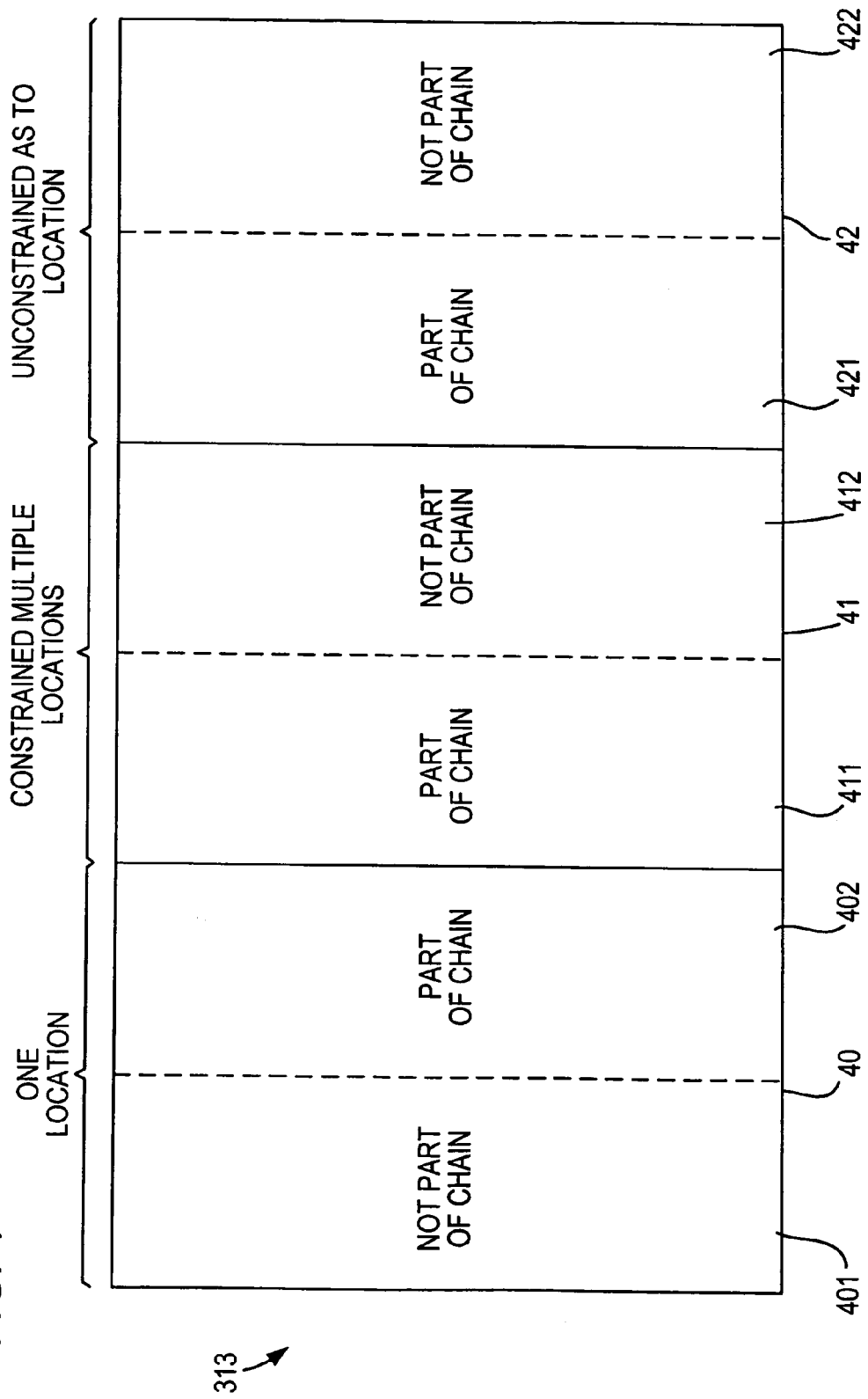
FIG. 4 is a diagrammatic representation of an array of multiplier-related operations sorted in accordance with a preferred embodiment of the present invention.

The output of Input Shift Register Chain Inferencing step 24 is a modified netlist 25. Modified netlist 25 preferably is then preprocessed by main grouping or clustering stage 26 according to the invention, a preferred embodiment of which is shown in FIG. 3 and discussed in connection therewith, and which attempts to group all MAC functions in the available specialized multiplier blocks 10 as efficiently as possible. Main grouping or clustering stage 26 produces a further modified netlist 27, which preferably is then processed by place-and-route routine 28, which is essentially conventional except that it can recognize and use the MAC-related groupings (if any—all user designs preferably are processed through method 20, including preprocessing through step 24 and stage 26, even if they do not include any MAC functions) in further modified netlist 27 when implementing the final circuit design 29. Place-and-route routine 28 need only be concerned with placing the grouped specialized multiplier blocks, and not their constituents elements which have already been grouped therewithin by stage 26.

A preferred embodiment of main grouping or clustering stage 26 is shown in more detail in FIG. 3.

Further modified netlist 25 is input at 300 and tested at test 301 for the presence of MAC elements. If there are no MAC elements, then at step 302, further modified netlist 27 is output without change from modified netlist 25. However, if at test 301 MAC elements are found, then at step 303 "MAC slices" are created from the MAC elements in netlist 25.

A "MAC slice" is a grouping of a MAC_out element and all the MAC_mult elements that feed that MAC_out element. For example, if a MAC operation is a simple multiplication, then the MAC_out element is an output or simple wire element, and there is only one MAC_mult element which is the multiplier that performs the multiplication. At the other extreme is a so-called "two-level add" where four multiplications occur, two of the products are added to form a first sum, the other two products are added to form a second sum, and the first and second sums are added to form a final sum. In that case, the three adders make up the MAC_out element and the four multipliers are the MAC_mult elements that feed that MAC_out element, so that the MAC slice includes the four multipliers and the three adders. Some examples of intermediate cases include a MAC slice having two multipliers and an adder producing the sum of two products, or three multipliers and two adders, producing the sum of two products which is then added to a third product.

Thus, it is clear that the elements of a MAC slice should be kept together within a single specialized multiplier block, insofar as each MAC slice represents a fundamental type of arithmetic operation for which the specialized multiplier block preferably is designed. The MAC slices are entered in an array at step 304.

A hardware description of the particular programmable logic device preferably is entered at 305, and is used at step 306 to create a mapping, which is entered into an array at 307, of the numbers and locations of specialized multiplier blocks 10 in the device. Thus, not only does the method of the invention relieve the user and the synthesis tool from needing to know about the constraints of the specialized multiplier blocks, but the ability to use this mapping as an input makes even the method of the invention hardware-independent, at least within a given family of hardware in which the specialized multiplier blocks 10 have certain characteristics which the method is programmed to "know," as long as a hardware description is provided that specifies the number and placement of specialized multiplier blocks 10. The mapping array data preferably is used at step 308 to determine from the array 304 of MAC slices the legal position, in the programmable logic device, of each MAC slice, given the number and location of specialized multiplier blocks 10 and the characteristics of specialized multiplier blocks 10 that constrain MAC slice locations. If the user has imposed any location constraints on a particular MAC slice, those constraints preferably are included in determining the legal position of that MAC slice. Conversely, if the user has not imposed any location constraints on a particular MAC slice, then preferably all physical MAC block locations are considered legal for that MAC slice. The legal position or positions for each MAC slice preferably are stored in an array 309.

MAC slice array 304 preferably is processed at step 310 as well, to determine which MAC slices are parts of input shift register chains, whether specified by the user or inferred in step 24. The result is an array 311 of shift register chains.

Array 309 of MAC slice legal positions and array 311 of input shift register chains preferably are used at sorting step 312 to produce a sorted array 313 of MAC slices. One preferred sorting scheme is diagrammed in FIG. 4. As seen there, array 313 preferably is sorted into grouping 40 of MAC slices having only one legal location, grouping 41 of MAC slices subject to location constraints but having more than one legal location, and grouping 42 of MAC slices unconstrained with respect to location. Within grouping 40 preferably are subgrouping 401 of MAC slices that do not belong to any input shift register chain, and subgrouping 402 of MAC slices that do belong to input shift register chains. Similarly, within grouping 41 preferably are subgrouping 411 of MAC slices that belong to input shift register chains, and subgrouping 412 of MAC slices that do not belong to input shift register chains, and within grouping 42 preferably are subgrouping 421 of MAC slices that belong to input shift register chains, and subgrouping 422 of MAC slices that do not belong to input shift register chains.

After array 313 has been sorted at step 312, sorted array 313 optionally may be prefiltered at step 314 to determine whether any two of the MAC slices in grouping 40, each of which is constrained to a single legal location, are constrained to the same single location. If so, then the user design cannot be placed, an error message is generated, and stage 26 ends. Preferably, method 20 ends as well.

If prefiltering step 314 does not result in an error, or if prefiltering step 314 is not used, then grouping of MAC slices within the available specialized multiplier blocks preferably is carried out in steps 315, 316, 317. In step 315, using the specialized multiplier block mapping data in array 307, those MAC slices in grouping 40 preferably are grouped first, insofar as if a location is not available for any MAC slice that has one only legal location, then the user design cannot be placed. Within grouping 40, step 315 attempts first to group MAC slices in subgrouping 401—i.e., those that have only one legal location and are not part of any input shift register chain—before attempting to group MAC slices in subgrouping 402—i.e., those each of which has only one legal location but is part of an input shift register chain—because there is no point in expending effort to try to group entire chains (including the other MAC slices in each chain, that otherwise might be unconstrained as to location) if there is any unchained MAC slice that cannot be grouped.

It will be appreciated that if two MAC slices are constrained to the same single location and prefilter 314 is not used, then step 315 will group the first of those two MAC slices into the single location, and when step 315 attempts to group the second of those two MAC slices into that location, the location will be unavailable and step 315 will fail. That is why prefilter step 314 is optional, as it does not change the result but only saves a small amount of time. There are other reasons why step 315 might fail. For example, step 315 might succeed in grouping all MAC slices in subgrouping 401. Moving on to subgrouping 402, it might be found that for one of the MAC slices in subgrouping 402, the single location to which that MAC slice is constrained might be available, but the input shift register chain to which that MAC slice belongs might overlap one of the already-grouped MAC slices from subgrouping 401. As a result, a MAC slice that is unconstrained as to location but is part of an input shift register chain that includes a MAC slice that is constrained to a single location, is effectively constrained to an occupied location, resulting a failure condition, although it may be possible to break that particular chain and substitute general-purpose routing, outside the specialized multiplier block, as discussed below. In another example, if the last MAC slice in an input shift register chain needs access to general purpose routing, but ends up in a location where such access is not available, a failure condition could result, although here again it might be possible to break up the input shift register chain to prevent a failures. If there is a failure at step 315 in processing subgrouping 401, stage 26 preferably issues an error message at 318 and ends. Preferably, method 20 ends as well. If there is a failure at step 315 in processing subgrouping 402, a failure condition could occur, or stage 26 could continue as discussed below.

If step 315 does not fail, then step 316 attempts to group the MAC slices in grouping 41, which are constrained as to location, but have more than one legal location. In this step, MAC slices that are part of input shift register chains (subgrouping 411) preferably are processed before MAC slices that are not part of input shift register chains (subgrouping 412). That is because as long as each MAC slice has more than one legal location, even if the locations are constrained, it is deemed more important in the preferred embodiment to try to keep input shift register chains together. Step 316 preferably not only uses the mapping data in array 307, but preferably also uses an array 320 of "gain" data computed at step 319 based on the contents of netlist 25 and MAC slice array 304. Gain array 320 preferably is a two-dimensional array containing, for each pair MAC slices in array 304, a number representing the affinity of the members of that pair of MAC slices one for the other—i.e., how important it is for those MAC slices to be near one another. All other things being equal, step 316 preferably attempts to keep near one another the members of those pairs of MAC slices having the highest gains. A preferred method for computing gain according to the invention is described below. If step 316 fails to group any MAC slice, a failure condition (not shown) could occur as discussed above in connection with step 315, but preferably stage 26 merely continues to step 317, handling the failure as discussed below.

Step 317 attempts to group the MAC slices in grouping 42, which are unconstrained as to location. In this step, MAC slices that are part of input shift register chains (subgrouping 421) preferably are processed before MAC slices that are not part of input shift register chains (subgrouping 422). That is because, as in step 316, as long as each MAC slice has more than one legal location, it is deemed more important in the preferred embodiment to try to keep input shift register chains together. Step 317 preferably not only uses the mapping data in array 307, but, like step 316, preferably also uses the data in gain array 320. All other things being equal, step 317 preferably attempts to keep near one another the members of those pairs of MAC slices having the highest gains.

At this step, many MAC slices have already been grouped (including unconstrained MAC slices that are part of input shift register chains that include constrained MAC slices), so that at least some of the specialized multiplier blocks are partially full (others may be completely full, including some that are filled by a single slice such as a "two-level add" which is described above). Step 317 preferably attempts to group the unconstrained MAC slices first into partially used specialized multiplier blocks 10 before grouping them into completely unused specialized multiplier blocks 10. In doing so, step 317 could begin with ungrouped MAC slices, and look for available slots in partially used specialized multiplier blocks 10, or could start with partially used specialized multiplier blocks 10 and look for MAC slices to fill them. Either way, step 317 must take account not only of the available MAC functions in each partially used specialized multiplier block 10, but also of the clocks and control signals that may be required by a candidate MAC slice, because a specialized multiplier block 10 that has the necessary MAC functions available may not have all the necessary clocks and control signals available, depending on which clocks and control signals have been consumed by the functions already grouped into that block 10.

If step 317 fails to group any MAC slice, a failure condition (not shown) could occur as discussed above in connection with step 315, but preferably stage 26 merely continues to test 321, where any failures in steps 316 and 317, and possible failures in step 315 (subgrouping 402 only), are handled.

At test 321, stage 26 checks to see if all MAC slices have been grouped into specialized function blocks 10. As just discussed, it is possible to reach test 321 without all MAC slices having been grouped. If at test 321 it is determined all MAC slices have been grouped, stage 26 preferably proceeds to step 322 and produces an array of MAC slices with grouping information, which preferably is then used in step 323 to create rebuilt netlist 27 in which all MAC functions are grouped into specialized multiplier blocks, so that place-androute routine 28 needs only place and route the specialized multiplier blocks without regard to the underlying MAC functions. Stage 26 ends at that point.

However, if at test 321 it is determined that not all MAC slices have been grouped into specialized function blocks 10, then at step 324, stage 26 returns to step 315 and makes another attempt to group array 304 of MAC slices, unless a maximum number of attempts has been reached. As discussed below, certain changes can be made on each successive attempt, so that an initial inability to group does not necessarily lead ultimately to failure. It has been determined empirically that in a preferred embodiment one hundred attempts is a reasonable maximum number of attempts. Although in some cases there might have been success on a one hundred and first or one hundred and second attempt, it is believed that generally any attempt beyond the hundredth attempt is unlikely to succeed and would only be a waste of time and resources.

In the preferred embodiment, on any second or subsequent attempt, one change that is made is that the ordering of MAC slices is changed so that MAC slices that were unable to be grouped are processed earlier, and preferably first, regardless of their location within one of groupings 40, 41 and 42. Thus, in any of steps 315, 316, 317, if one or MAC slices were unable to be grouped, then on a second or subsequent attempt those MAC slices might be moved ahead of any MAC slice from subgrouping 401, 411 or 421, respectively, even if the ungrouped MAC slices were from subgrouping 402, 412 or 422 (although because of the nature of the MAC slices in subgrouping 401, it may be better not to repeat step 315 at all, or if step 315 is repeated, to change only the order of MAC slices within subgrouping 402). Reordering of MAC slices can change the outcome of steps 315-317—i.e., can change failure to success—because where there is more than one possible grouping for a first MAC slice, the method ordinarily stops at the first successful grouping. If that grouping happened to have been the only remaining possible grouping for a second MAC slice, then it would not be possible to group the second MAC slice on that pass. However, processing the second MAC slice first on a subsequent pass might result in successful grouping for both the first and second MAC slices.

A failed attempt to group an input shift register chains also could be handled differently on a subsequent attempt. If a grouping failure involves the inability to group the MAC slices in an input shift register chain, then on a subsequent pass, the attempt to group the chain could use a different starting location for the chain. If that fails, on further subsequent passes, chains could be broken, with the broken connections directed to general purpose interconnect routing. For example, if a chain starts near the bottom of a column of specialized multiplier blocks, and the chain is longer than the number of specialized multiplier blocks between the starting location and the edge of the programmable logic device, that chain cannot be grouped. If that chain cannot be started elsewhere, where it might fit, then the chain would have to be broken to prevent a grouping failure. The breaking of chains could be limited to chains inferred by step 24, or all chains, including user-defined chains, could be subject to being broken.

If the maximum number of retries has been attempted, and at test 321 not all MAC slices have been grouped, then an error message is issued at step 318 and stage 26 preferably ends. Method 20 preferably ends as well.

If stage 26 ends with a grouping failure, then preferably, as an aid to the user in modifying the design so that it can be grouped and placed, stage 26 may (not shown) make one additional attempt during which user-imposed constraints are ignored. If such an attempt is successful, the design preferably is not grouped and placed, but the user may be notified as part of the failure message that the design could be grouped and placed if the constraints are removed.

Optionally, even if stage 26 is successful, one or more additional passes (not shown) may be made through stage 26 to see if a more efficient grouping can be achieved. For example, in a second or subsequent pass, an element that is not constrained to a particular location might not be grouped into the first location that is available, but into one of the other locations. This might free up more efficient locations for other elements.

As discussed above, the grouping of MAC slices preferably depends in part on the "gain" between each pair of MAC slices, with attempts made to group in the same specialized multiplier block 10, or in adjacent blocks 10, those MAC slices that have the highest gain, or affinity for one another. The calculation of that gain will now be explained.

The gain between the ith and jth MAC slices may be denoted as $GAIN_{ij}$, and preferably is based on some or all of the following:

1. A gain associated with the number of common nets feeding both the ith and jth MAC slices. This gain may be called $NET\_GAIN_{ij}$.
2. A gain associated with the number of common circuit element groupings which are feeding and are fed by both the ith and jth MAC slices. A circuit element grouping is a collection of circuit elements which will be kept together throughout a large majority of the placement phase. These circuit element groupings may be called "clusters," and this gain may be called $CLUSTER\_GAIN_{ij}$.
3. In a preferred embodiment, where the programmable logic device in question is one sold by Altera Corporation and the programming tool is the aforementioned QUARTUS® II software, a gain for both the ith and jth MAC slices belonging to the same floating LogicLock region (a feature of certain Altera Corporation programmable logic devices which is described, e.g., in copending, commonly-assigned U.S. patent application Ser. Nos. 10/160,474, filed May 31, 2002, and 10/194,199, filed Jul. 12, 2002, which are hereby incorporated by reference in their entireties). This gain may be called $FLR\_GAIN_{ij}$.
4. In the preferred embodiment where the programmable logic device in question is one sold by Altera Corporation and the programming tool is the aforementioned QUARTUS® II software, a gain for both the ith and jth MAC slices belonging to the same floating LogicLock region and having the same relative offsets. This gain may be called $FLR\_RO\_GAIN_{ij}$.

Therefore, the gain of grouping the ith and jth MAC slices together is equal to:

$$GAIN_{ij} = NET\_GAIN_{ij} + CLUSTER\_GAIN_{ij} + FLR\_GAIN_{ij} + FLR\_RO\_GAIN_{ij}.$$

The higher the gain the more desirable it is to group the two MAC slices.

$NET\_GAIN_{ij}$ may be computed as the sum of:
1. A gain associated with the number of common nets feeding the control signal ports of both the ith and jth MAC slices. This gain may be called $CONTROL\_SIGNAL\_NET\_GAIN_{ij}$.
2. A gain associated with the number of common nets feeding the data input ports of both the ith and jth MAC slices. This gain may be called $DATA\_IN\_NET\_GAIN_{ij}$.

3. A gain associated with the number of nets sourced by either the ith or jth MAC slice which originate at the regular data output ports and feed the other MAC slice. The input shift register output ports are not considered in this gain because using those connections implies a set of restrictions which are handled elsewhere as discussed above. This gain may be called MAC_SLICE_NET_GAIN$_{ij}$.

Therefore, the gain associated with the number of common nets feeding both the ith and jth MAC slices is:

NET_GAIN$_{ij}$=CONTROL_SIGNAL_NET_GAIN$_{ij}$+ DATA_IN_NET_GAIN$_{ij}$+MAC_SLICE_ NET_GAIN$_{ij}$

These components may be computed as follows:

If β(A,B)=the number of connections on net A that feed MAC slice B, and

α$_n$ is the set which contains the union of all nets in the input netlist which feed any of the control signal input ports on the ith or jth MAC slice, and η=the number of nets in α, and MS$_i$ or MS$_j$ is the ith or jth MAC slice, then CONTROL_SIGNAL_NET_GAIN$_{ij}$=

$$\lambda_1 \left( \sum_{n=1}^{\eta} \sqrt{\frac{\beta(\alpha_n, MSi) \times \beta(\alpha_n, MSj)}{\text{fanout from } \alpha_n}} \right)$$

This gain preferably is weighted by 1/(fanout of net) so that lower fanout nets contribute more to the gain than higher fanout nets. The constant $\lambda_1$ preferably is used to vary the contribution that the control signal net gain makes to the overall gain of grouping MS$_i$ and MS$_j$. The value of $\lambda_1$ preferably is different for different grouping attempts. More precisely, in the initial grouping attempts the control signal net gain preferably makes very little contribution to the overall gain, but in the final grouping attempts it preferably contributes a lot. The reasoning behind this result is that if the final grouping attempt is reached this may imply that there are control signal constraint conflicts. Therefore, paying more attention to grouping MAC slices which use the same control signals may help resolve those issues.

If α$_n$ is the set which contains the union of all nets in the input netlist which feed any of the data input ports on the ith or jth MAC slice, and η=the number of nets in α, then DATA_IN_NET_GAIN$_{ij}$=

$$\lambda_2 \left( \sum_{n=1}^{\eta} \sqrt{\frac{\beta(\alpha_n, MSi) \times \beta(\alpha_n, MSj)}{\text{fanout from } \alpha_n}} \right)$$

This gain preferably is weighted by 1/(fanout of net) so that lower fanout nets contribute more to the gain than higher fanout nets. The constant $\lambda_2$ is used to vary the contribution that the data_in_net_gain makes to the overall gain of grouping the ith and jth MAC slices. In the preferred embodiment, the value of $\lambda_2$ has been set empirically to 8.

If α$_n$ is the set which contains all nets in the input netlist which are sourced by any of the data output ports on the ith MAC slice, and η=the number of nets in α, and δ$_m$ is the set which contains all nets in the input netlist which are sourced by any of the data output ports on the jth MAC slice, and κ=the number of nets in δ, then MAC_SLICE_NET_GAIN$_{ij}$=

$$\lambda_3 \left( \left( \sum_{n=1}^{\eta} \sqrt{\frac{\beta(\alpha_n, MSj)}{\text{fanout from } \alpha_n}} \right) + \left( \sum_{m=1}^{\kappa} \sqrt{\frac{\beta(\delta_m, MSi)}{\text{fanout from } \delta_m}} \right) \right)$$

This gain preferably is weighted by 1/(fanout of net) so that lower fanout nets contribute more to the gain than higher fanout nets. The constant $\lambda_3$ is used to vary the contribution that the MAC slice net gain makes to the overall gain of grouping the ith and jth MAC slice. In the preferred embodiment, the value of $\lambda_3$ has been set empirically to 15.

CLUSTER_GAIN$_{ij}$ accounts for the fact that even though two MAC slices may have nothing in common based on nets, they may, e.g., have respective net coming from two logic elements that are grouped in the same logic block of the programmable logic device. Therefore, it is advantageous to keep them near one another. CLUSTER_GAIN$_{ij}$ may be broken into two components.

1. A gain associated with the number of clusters feeding the data input ports of both the ith and jth MAC slices. This gain may be called DATA_IN_CLUSTER_GAIN$_{ij}$.
2. A gain associated with the number of clusters fed by the data output ports of both the ith and jth MAC slices. This gain may be called DATA_OUT_CLUSTER_GAIN$_{ij}$.

Therefore,

CLUSTER_GAIN$_{ij}$=DATA_IN_CLUSTER_GAIN$_{ij}$+ DATA_OUT_CLUSTER_GAIN$_{ij}$

If τ=the number of clusters in a user design, and

α$_{p,n}$=a set of nets sourced by the pth cluster which feed the ith MAC slice, and η$_p$=the number of nets in α$_{p,n}$, and δ$_{p,m}$=a set of nets sourced by the pth cluster which feed the jth MAC slice, and κ=the number of nets in δ$_{p,m}$, then DATA_IN_CLUSTER_GAIN$_{ij}$=

$$\lambda_4 \left( \sum_{p=1}^{\tau} \left( \sqrt{\left( \sum_{n=1}^{\eta_p} \frac{\beta(\alpha_p, n, MSi)}{\text{fanout from } \alpha_p, n} \right) \times \left( \sum_{m=1}^{\kappa_p} \frac{\beta(\delta_p, m, MSj)}{\text{fanout from } \delta_p, m} \right)} \right) \right)$$

This gain is weighted by 1/(fanout of net) so that lower fanout nets contribute more to the gain than higher fanout nets. The constant $\lambda_4$ is used to vary the contribution that the data_in_cluster_gain makes to the overall gain of grouping the ith and jth MAC slices. In the preferred embodiment, the value of $\lambda_4$ has been set empirically to 2.

Similarly, if φ$_p$=a set of all clusters which exist in the user design, and

τ=the number of clusters in a user design, and

α$_i$=a set of nets sourced by the data ports of the ith MAC slice, and

η=the number of nets in α$_i$, and

δ$_j$=a set of nets sourced by the data ports of the jth MAC slice, and

κ=the number of nets in δ$_j$, then DATA_OUT_CLUSTER_GAIN$_{ij}=$ $$\lambda_5 \left( \sum_{p=1}^{\tau} \sqrt{\left( \left( \sum_{n=1}^{\eta} \frac{\beta(\alpha_n, \varphi_p)}{\text{fanout from } \alpha_n} \right) \times \left( \sum_{m=1}^{\kappa} \frac{\beta(\delta_m, \varphi_p)}{\text{fanout from } \delta_m} \right) \right)} \right)$$

This gain is weighted by 1/(fanout of net) so that lower fanout nets contribute more to the gain than higher fanout nets. The constant $\lambda_5$ is used to vary the contribution that the data_out_cluster_gain makes to the overall gain of grouping the ith and jth MAC slices. In the preferred embodiment, the value of $\lambda_5$ has been set empirically to 1.

If both the ith and jth MAC slices belong in a floating LogicLock region, and they belong to the same floating LogicLock region, then:

FLR_GAIN$_{ij}=\lambda_6$

Otherwise,

FLR_GAIN$_{ij}=0$

In the preferred embodiment, the value of 6 has been set empirically to 10,000. Therefore, this gain will outweigh all the other terms in the gain function and keep these two MAC slices together, as they must be to be in the same floating LogicLock region.

If both the ith and jth MAC slices have a floating LogicLock region relative offset, and they both have the same relative offset, then:

FLR_RO_GAIN$_{ij}=$FLR_GAIN$_{ij}$

Otherwise,

FLR_RO_GAIN$_{ij}=0$

This term is 0 if FLR_GAIN$_{ij}$ is 0, but is 10,000 if FLR_GAIN$_{ij}$ is 10,000, so that for MAC slices that are both in the same floating LogicLock region, and that both have a floating LogicLock region relative offset and those relative offsets are the same, FLR_GAIN$_{ij}$ and FLR_RO_GAIN$_{ij}$ contribute a total gain of 20,000. Therefore, this gain will outweigh all the other terms in the gain function and keep these two MAC slices together, as they must be to be in the same floating LogicLock region with the same relative offset.

Programmable logic devices programmed in accordance with the invention may be used in many kinds of electronic devices. One possible use is in a data processing system that also may include one or more of the following components: a processor; memory; I/O circuitry; and peripheral devices. These components may be coupled together by a system bus and are populated on a circuit board which is contained in an end-user system.

The end user system can be used in a wide variety of applications, such as computer networking, data networking, instrumentation, video processing, digital signal processing, or any other application where the advantage of using programmable or reprogrammable logic is desirable. The programmable logic device ("PLD") can be used to perform a variety of different logic functions. For example, the PLD can be configured as a processor or controller that works in cooperation with the main system processor. The PLD may also be used as an arbiter for arbitrating access to shared resources in the system. In yet another example, the PLD can be configured as an interface between the processor and one of the other components in the system.

Various technologies can be used to implement PLDs of the type described above and that can be programmed according to this invention.

Instructions for carrying out the method according to this invention may be encoded on a machine-readable medium, to be executed by a suitable computer or similar device to implement the method of the invention for programming PLDs. For example, a personal computer may be equipped with an interface to which a PLD can be connected, and the personal computer can be used by a user to program the PLD using a suitable software tool, such as the QUARTUS® II software described above.

Figure 5:
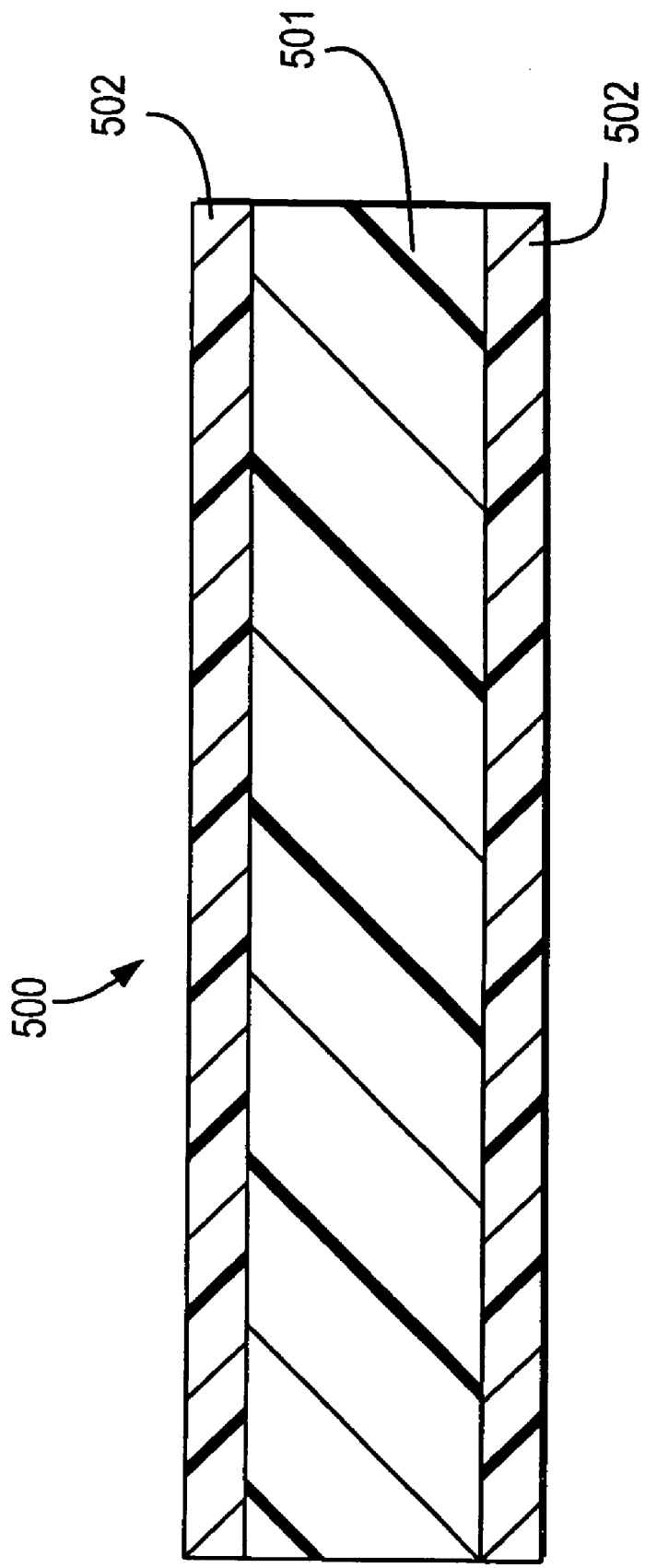
FIG. 5 is a cross-sectional view of a magnetic data storage medium encoded with a set of machine-executable instructions for performing the method according to the present invention.

FIG. 5 presents a cross section of a magnetic data storage medium 500 which can be encoded with a machine executable program that can be carried out by systems such as the aforementioned personal computer, or other computer or similar device. Medium 500 can be a floppy diskette or hard disk, having a suitable substrate 501, which may be conventional, and a suitable coating 502, which may be conventional, on one or both sides, containing magnetic domains (not visible) whose polarity or orientation can be altered magnetically. Medium 500 may also have an opening (not shown) for receiving the spindle of a disk drive or other data storage device.

The magnetic domains of coating 502 of medium 500 are polarized or oriented so as to encode, in manner which may be conventional, a machine-executable program such as that described above in connection with FIGS. 2-4, for execution by systems such as the aforementioned personal computer or other computer or similar system.

Figure 6:
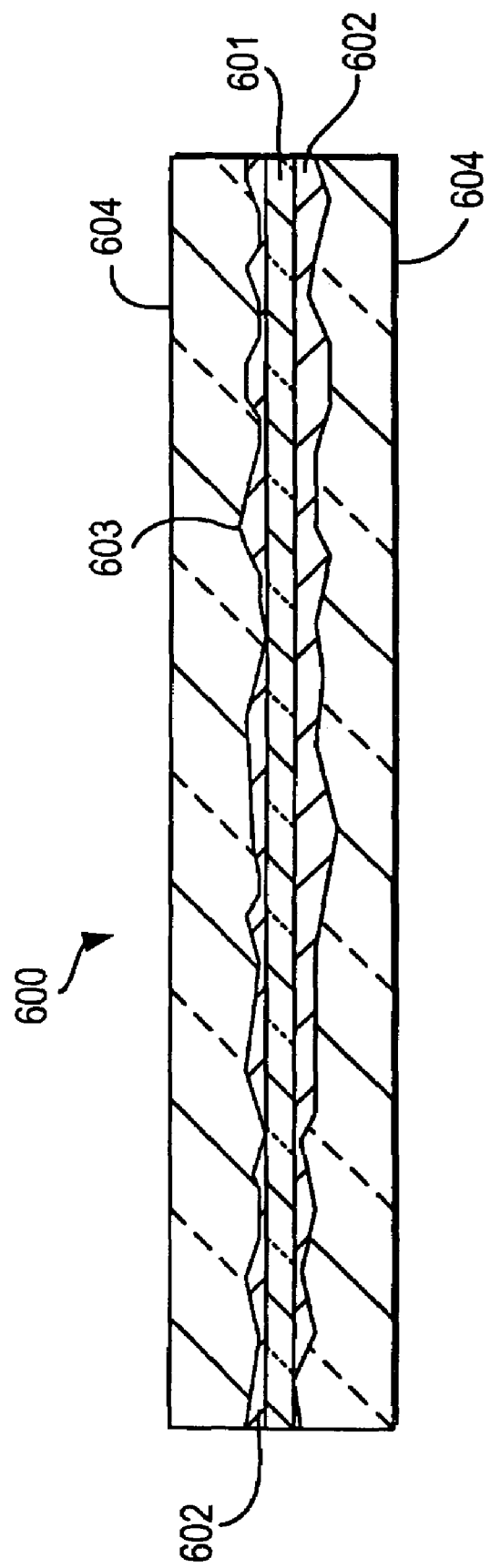
FIG. 6 is a cross-sectional view of an optically readable data storage medium encoded with a set of machine executable instructions for performing the method according to the present invention.

FIG. 6 shows a cross section of an optically-readable data storage medium 600 which also can be encoded with such a machine-executable program, which can be carried out by systems such as the aforementioned personal computer, or other computer or similar device. Medium 600 can be a conventional compact disk read only memory (CD-ROM) or digital video disk read only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 600 preferably has a suitable substrate 601, which may be conventional, and a suitable coating 602, which may be conventional, usually on one or both sides of substrate 601.

In the case of a CD-based or DVD-based medium, as is well known, coating 602 is reflective and is impressed with a plurality of pits 603, arranged on one or more layers, to encode the machine-executable program. The arrangement of pits is read by reflecting laser light off the surface of coating 602. A protective coating 604, which preferably is substantially transparent, is provided on top of coating 602.

In the case of magneto-optical disk, as is well known, coating 602 has no pits 603, but has a plurality of magnetic domains whose polarity or orientation can be changed magnetically when heated above a certain temperature, as by a laser (not shown). The orientation of the domains can be read by measuring the polarization of laser light reflected from coating 602. The arrangement of the domains encodes the program as described above.

It will be understood that the foregoing is only illustrative of the principles of the invention, and that various modifications can be made by those skilled in the art without departing from the scope and spirit of the invention, and the present invention is limited only by the claims that follow.

What is claimed is:

1. For use with a programmable logic device including one or more specialized multiplier blocks, each said specialized multiplier block comprising at least one multiplier and at least one other arithmetic element, a method of programming such a programmable logic device with a user design, said user design comprising a plurality of logic elements to be programmed, said method comprising:

reading a description file for said programmable logic device to determine number and location of said specialized multiplier blocks;

parsing a list of said logic elements to be programmed for said user design;

identifying, in said list of logic elements to be programmed for said user design, logic elements to be programmed that are related to said specialized multiplier blocks; and preprocessing said logic elements to be programmed that are related to said specialized multiplier blocks, using said number and location read from said description file, prior to processing said list of logic elements to be programmed for said programmable logic device, to make a preliminary assignment, to said one or more specialized multiplier blocks, of said logic elements to be programmed that are related to said specialized multiplier blocks.

2. The method of claim 1 wherein said identifying logic elements to be programmed that are related to said specialized multiplier blocks comprises identifying logic elements to be programmed that are designated by said user as relating to one or more of said specialized multiplier blocks.

3. The method of claim 1 wherein said identifying logic elements to be programmed that are related to said specialized multiplier blocks comprises identifying logic elements to be programmed that are related to at least one multiplier.

4. The method of claim 3 wherein said identifying logic elements to be programmed that are related to said specialized multiplier blocks comprises identifying logic elements to be programmed that are related to at least one multiplier and to at least one other arithmetic operator associated with said at least one multiplier.

5. The method of claim 4 wherein said at least one arithmetic operator is selected from the group consisting of addition, subtraction, accumulation, and combinations thereof.

6. The method of claim 1 wherein said preprocessing is carried out within constraints imposed by characteristics of said specialized multiplier blocks.

7. The method of claim 6 wherein said preprocessing is carried out to optimize said logic elements to be programmed for said programmable logic device.

8. The method of claim 1 wherein said preprocessing comprises creating a subset within said list of logic elements to be programmed, said subset comprising preprocessed logic elements to be programmed specifying functions to be performed within said specialized multiplier blocks.

9. The method of claim 8 further comprising:
joining at least one multiplier element to be programmed with a logic element to be programmed representing another function to create at least one logic element to be programmed each of which represents a specialized multiplier unit.

10. A data storage medium encoded with machine-executable instructions for performing a method, for use with a programmable logic device including one or more specialized multiplier blocks, each said specialized multiplier block comprising at least one multiplier and at least one other arithmetic element, of programming such a programmable logic device with a user design, said method comprising:

reading a description file for said programmable logic device to determine number and location of said specialized multiplier blocks;

parsing a list of logic elements to be programmed that are for said user design;

identifying, from said list of logic elements to be programmed that are for said user design, logic elements to be programmed that are related to said specialized multiplier blocks; and preprocessing said logic elements to be programmed that are related to said specialized multiplier blocks, using said number and location read from said description file, prior to processing said list of logic elements to be programmed that are for said programmable logic device, to make a preliminary assignment, to said one or more specialized multiplier blocks, of said logic elements to be programmed that are related to said specialized multiplier blocks.

11. The data storage medium of claim 10 wherein in said method said identifying logic elements to be programmed that are related to said specialized multiplier blocks comprises identifying logic elements to be programmed that are designated by said user as relating to one or more of said specialized multiplier blocks.

12. The data storage medium of claim 10 wherein in said method said identifying logic elements to be programmed that are related to said specialized multiplier blocks comprises identifying logic elements to be programmed that are related to at least one multiplier.

13. The data storage medium of claim 12 wherein in said method said identifying logic elements to be programmed that are related to said specialized multiplier blocks comprises identifying logic elements to be programmed that are related to at least one multiplier and to at least one other arithmetic operator associated with said at least one multiplier.

14. The data storage medium of claim 13 wherein said at least one arithmetic operator is selected from the group consisting of addition, subtraction, accumulation, and combinations thereof.

15. The data storage medium of claim 10 wherein, in said method, said preprocessing is carried out within constraints imposed by characteristics of said specialized multiplier blocks.

16. The data storage medium of claim 15 wherein, in said method, said preprocessing is carried out to optimize said logic elements to be programmed for said programmable logic device.

17. The data storage medium of claim 10 wherein in said method said preprocessing comprises creating a subset within said list of logic elements to be programmed, said subset comprising preprocessed logic elements to be programmed specifying functions to be performed within said specialized multiplier blocks.

18. The data storage medium of claim 17 wherein said method further comprises:
joining at least one multiplier element to be programmed with a logic element to be programmed representing another function to create at least one logic element to be programmed each of which represents a specialized multiplier unit.

19. The data storage medium of claim 10 wherein said data storage medium is magnetic.

20. The magnetic data storage medium of claim 19 wherein said data storage medium is a floppy diskette.

21. The magnetic readable data storage medium of claim 19 wherein said data storage medium is a hard disk.

22. The data storage medium of claim 10 wherein said data storage medium is optically readable.

23. The optically readable data storage medium of claim 22 wherein said data storage medium is selected from the group consisting of (a) a CD-ROM, (b) a CD-R, (c) a CD-RW, (d) a DVD-ROM, (e) a DVD-R, (f) a DVD-RW, (g) a DVD+R, (h) a DVD+RW and (i) a DVD-RAM.

24. The optically readable data storage medium of claim 22 wherein said data storage medium is a magneto-optical disk.

* * * * *